(12) United States Patent
Agarwal

(10) Patent No.: US 7,327,300 B1
(45) Date of Patent: Feb. 5, 2008

(54) SYSTEM AND METHOD FOR GENERATING A PULSE WIDTH MODULATED SIGNAL HAVING VARIABLE DUTY CYCLE RESOLUTION

(75) Inventor: Nitin Agarwal, Meerut (IN)

(73) Assignee: STMicroelectronics Pvt. Ltd., Noida, Uttar Pradesh (IN)

( * ) Notice: Subject to any disclaimer, the term of this patent is extended or adjusted under 35 U.S.C. 154(b) by 0 days.

(21) Appl. No.: 11/510,259

(22) Filed: Aug. 25, 2006

(30) Foreign Application Priority Data

Aug. 25, 2005 (IN) .................. 2280/DEL/2005

(51) Int. Cl.
*H03M 1/82* (2006.01)
(52) U.S. Cl. ........................ 341/152; 341/144

(58) Field of Classification Search ......... 341/130–155
See application file for complete search history.

(56) References Cited

U.S. PATENT DOCUMENTS

| | | | |
|---|---|---|---|
| 5,023,535 A | 6/1991 | Miller et al. | |
| 6,995,592 B2 * | 2/2006 | Agarwal | ................... 327/172 |

* cited by examiner

*Primary Examiner*—Lam T. Mai
(74) *Attorney, Agent, or Firm*—Graybeal Jackson Haley LLP

(57) ABSTRACT

A system and method generate a pulse width modulated signal having variable duty cycle resolution. A hardware uses minimal hardware to improve the PWM duty cycle resolution up to 0, such that highest possible resolution of a waveform can be obtained, including a sine wave. An embodiment of the invention uses a microcontroller, a divide by W counter, a delay circuit, a flip-flop, and a logic gate.

20 Claims, 3 Drawing Sheets

SYSTEM AND METHOD FOR GENERATING A PULSE WIDTH MODULATED SIGNAL HAVING VARIABLE DUTY CYCLE RESOLUTION

PRIORITY CLAIM

This application claims priority from Indian patent application No. 2280/Del/2005, filed Aug. 25, 2006, which is incorporated herein by reference.

TECHNICAL FIELD

The instant invention relates to a system and method for generating a pulse width modulated signal having variable duty cycle resolution.

BACKGROUND

Pulse width modulation (PWM) is a commonly used technique for generating precisely timed, repetitive digital waveforms. Resolution of a PWM waveform plays an important role in the quality of output generated. The granularity or resolution of the device output state depends upon the resolution of the PWM output used to control the device. For a given range of output states, higher resolution in the PWM translates into higher resolution of the device being controlled thereby. Resolution enhancements have typically relied upon hardware alterations on the controller side to provide for more PWM states at the output. However, such hardware based approaches are typically fraught with significant cost penalties and use of non-standardized components.

General-purpose microcontrollers are used for generation of Pulse Width Modulation (PWM) waveforms for different applications. Sine wave generation is one of the most useful applications where the PWM function of timers can be used. Sine wave resolution can be improved by improving PWM duty cycle resolution. One of most useful applications is Uninterruptible Power Supplies (UPSs) where sine wave resolution is important. Also in some applications if AC Mains frequency changes to a large extent, it may cause temporary or permanent damage to the operating device. During the change in AC Mains frequency, it is necessary to track the same.

While any variety of digital waveforms can be generated by periodically writing to the various ports of digital ICs, using timer output capture and the like, these all require direct CPU time for each output pulse. A great advantage of PWM is that once the registers are set up and enabled, the PWM waveforms are generated without any CPU overhead, so valuable CPU time can be utilized for other tasks.

However there are certain drawbacks to the same. Resolution of the pulse width modulated signal, which must be significantly higher than the input frequency, typically does not approach that of the input itself. A further problem that reduces available PWM accuracy and resolution is associated with timer interrupt latency inherent in current microprocessor-based control schemes. That is, transitions of the pulse width modulated signal from high to low and low to high are handled by a pulse width timer interrupt routine in software. Depending upon the instructions being executed when a pulse width timer interrupt occurs, four to seven microseconds can elapse before the software interrupt routine is executed. There is thus a quasi-random timing error of up to three microseconds, which can be viewed as noise on the PWM signal that adversely affects system performance, particularly in high response systems.

U.S. Pat. No. 5,023,535 entitled "HIGH RESOLUTION PULSE WIDTH MODULATION" provides a high-resolution pulse width modulation waveform using software, but the change in high time of pulse width modulated waveform is in multiple (s) of a microprocessor/microcontroller clock period.

A system that addresses the foregoing problems in the art and provide resolution up to a fraction of the time period of Central Processing Unit ($T_{CPU}$) is required.

SUMMARY

One aspect of the present invention makes use of only minimal hardware and thus provide a very cost effective solution. No computation algorithm required, which makes this technique efficient without any software overhead;

One aspect of the invention is to provide a system and method with improved resolution of the pulse width modulated signal.

Yet another aspect of the invention is to provide a PWM waveform whose resolution can be a fraction of $T_{CPU}$ according to the application requirement.

According to one aspect of the invention, a system for generating a Pulse Width Modulated signal having variable duty cycle resolution comprises a microcontroller for generating a master clock output; a divide by W counter having its input connected to said master clock output of said microcontroller providing a divided clock output; a delay circuit having its input connected to the output of said divide by W counter for introducing a delay in said divided clock output; a flip flop having its data input connected to a second output of said microcontroller and its clock being connected to the output of said delay circuit for shifting said second output of said microcontroller; and a logic gate receiving the outputs of said flip flop and said second output of said microcontroller for providing an improved resolution PWM waveform.

The delay circuit may include a multiplier block that feeds back the signal M number of times to introduce the desired delay. The system provides a PWM waveform with resolution up to a fraction of the time period of a clock during Central Processing Unit ($T_{CPU}$). The flip-flop may be a D-flip-flop. The logic gate may be an OR gate. The second signal on the second output may be a pulse width modulated signal.

A method for generating a Pulse Width Modulated signal having variable duty cycle resolution includes the steps of generating a master clock output; providing a divided master clock output; delaying said divided master clock output; shifting a pulse width modulated signal using said delayed signal as clock; and performing a logic operation on said pulse width modulated signal and shifted pulse width modulated signal to obtain an improved resolution PWM waveform.

The method can provide a PWM waveform with resolution up to a fraction of the time period of Central Processing Unit ($T_{CPU}$).

The logic operation may be an OR operation.

BRIEF DESCRIPTION OF THE DRAWINGS

The invention will now be described with reference to the accompanying drawings.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Resolution of a PWM output is the granularity with which the duty cycle can be modulated. The PWM duty cycle resolution determines the amount of precision with which the duty cycle can be changed. For example, a 10-bit resolution allows 1024 possible values for the duty cycle where an 8-bit resolution only allows 256 values. The PWM duty cycle resolution is defined as:

Resolution=1/number of divisions available in one PWM cycle

If an X-bit Auto Reload Timer (ART) is used, the resolution of PWM without using the novel apparatus will be:

Resolution=$1/(2^x$-Auto-Reload Value)

where X represents the number of bits.

It will be seen by the foregoing description that by using this invention, if a delay is $\delta(t)$, and $F_{COUNTER}=F_{CPU}/W$ and $T_{CPU}=N*\delta(t)$, the resolution will be Resolution=$1/((2^X$-Auto-Reload Value)*$W*N$)

where $F_{COUNTER}$ is the frequency of the divide by W counter, $F_{CPU}$ is the frequency of the microcontroller, W is the count of the divide by W counter, $T_{CPU}$ is the time period of the microcontroller clock and, N is the ratio of time period of CPU to the total delay.

If $\delta(t)$ approaches 0, N will approach infinity and resolution will also approach zero. But using the present invention, the change in a high time of a pulse width modulated waveform is in multiples of $\delta(t)$, where $\delta(t)$ is the delay provided by the delay circuit, which may be tending to 0. Thus, by using this invention, one can get continuous change in high time of a pulse width modulated waveform. Thus, the resolution is ideally improved to its highest value, which is 0.

Figure 1:
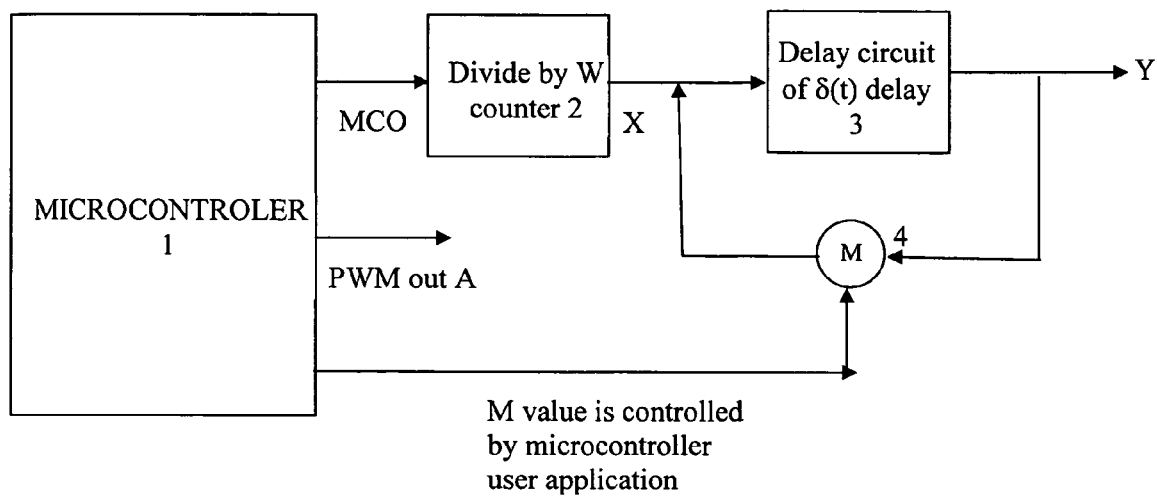
FIG. 1 relates to the block diagram of a PWM system in accordance with the instant invention.
Figure 1:
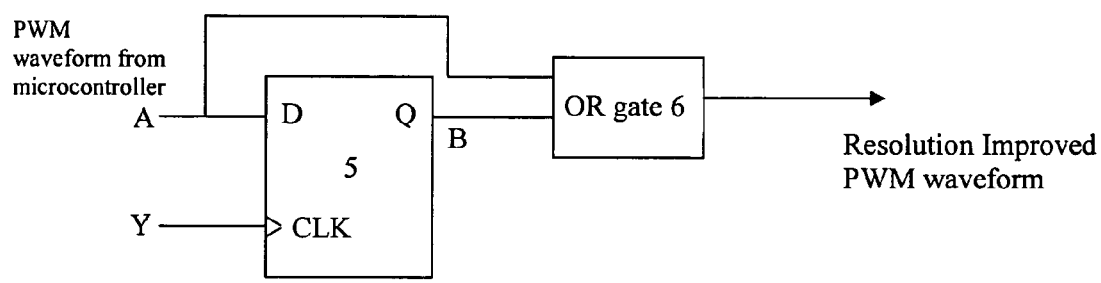

FIG. 1 is a block diagram of one embodiment of the present invention. It consists of a microcontroller 1, the outputs of which are connected to the inputs of a divide by W counter 2, a flip-flop 5 and feedback path 4 of delay circuit respectively. The output of the divide by W counter 2 is connected to a delay circuit 3, which in turn is connected to a flip-flop 5. The output of the flip-flop 5 is further connected to one of the inputs of an OR gate 6 while the other input of OR gate 6 is connected to one of the outputs of the microcontroller 1.

A common power supply of 5V can be used for driving all the external components as well as the microcontroller 1. The microcontroller 1 produces a Master Clock Out (MCO) signal and a Pulse Width Modulator (PWM) out signal which are synchronized at the edges. Further, the microcontroller 1 generates a control signal for controlling the delay in MCO out signal depending upon user application. This control signal manages the delay produced in the delay circuit 3 according to a user application.

The value of W in the divide by W counter 2 is a fixed value for a particular configuration of microcontroller 1 and the delay circuit 3. A low frequency output signal X of the divide by W counter 2 is delayed M times by the delay circuit 3 and fed to the clock input of the flip-flop 5. The flip-flop 5 outputs a signal B that is a shifted PWM signal A. The OR gate 6 performs an OR operation on the shifted PWM signal B and the normal PWM out signal A and provides the PWM out signal with a changed duty cycle by $M*\delta(t)/T_{PWM}$. If M varies from 1 to N*W, the improvement in resolution will be N*W times. It means:

$T_{COUNTER}=T_X=N_1*\delta(t)$ where N1=$N*W$ $T_{CPU}=N*\delta(t)$

An embodiment of the invention will now be described using an 8-bit PWMART timer for PWM duty cycle resolution computation. However, the invention is not restricted to the same. The parameters in case of an 8-bit PWMART timer are as follows:

$f_{CPU}$ is 8 MHz $f_{COUNTER}$ is 4 MHz Auto-Reload value is 00h, duty cycle register value is 80h, the value of N is 8 and resolution will be Resolution=$1/(_2N$–Auto-Reload Value) =1/256.

According to the aforesaid values W=$f_{CPU}/f_{COUNTER}$=2.

If $\delta(t)$ is 10 ns, N=$T_{CPU}/\delta(t)$=12.5. $T_{COUNTER}$ is divided into W*N=2*12.5=25 parts, so, the resolution improved is 25 times. The improvement in resolution directly depends on W and N.

Figure 2:
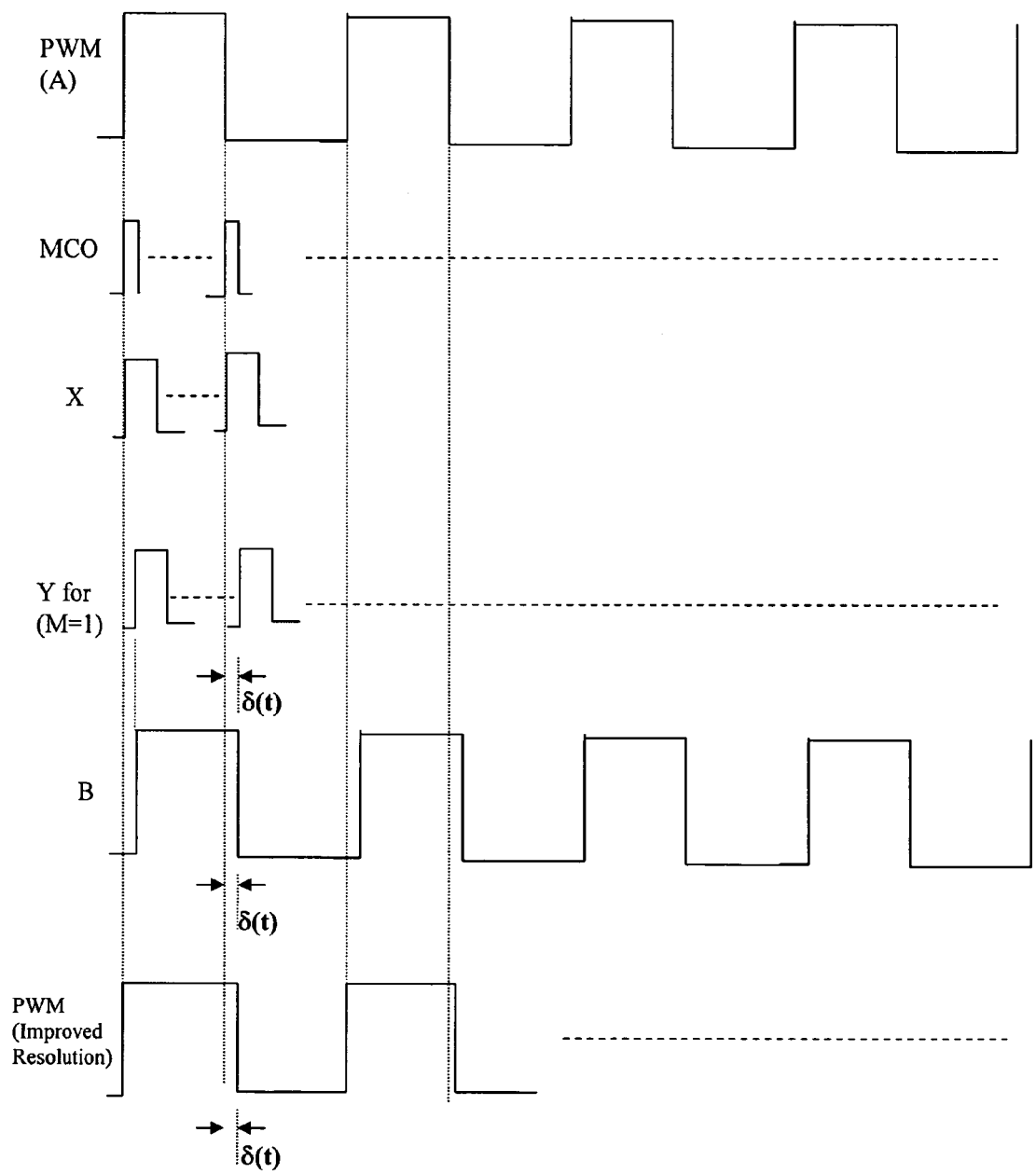
FIG. 2 illustrates the waveforms of PWM in accordance with the instant invention.

An embodiment of the invention will now be explained using the waveforms with reference to FIG. 2. For the purpose of explaining the waveforms, the value of M is taken as 1. The microcontroller 1 provides the Master Clock Out (MCO) signal and Pulse Width Modulator (PWM) out signal A which are synchronized at the edge of PWM out signal A. The signal X obtained from divide by W counter 2 is a reduced frequency signal as compared to the MCO signal having its rising edge synchronized with the edge of the MCO signal. The signal X is delayed by the delay circuit 3 to provide an output signal Y that acts as the clock of the flip-flop 5. The flip-flop 5 produces the output signal B that is shifted input signal A. The OR gate 6 in turn performs an OR operation on the two signals, namely A & B to, provide the final output.

Figure 3:
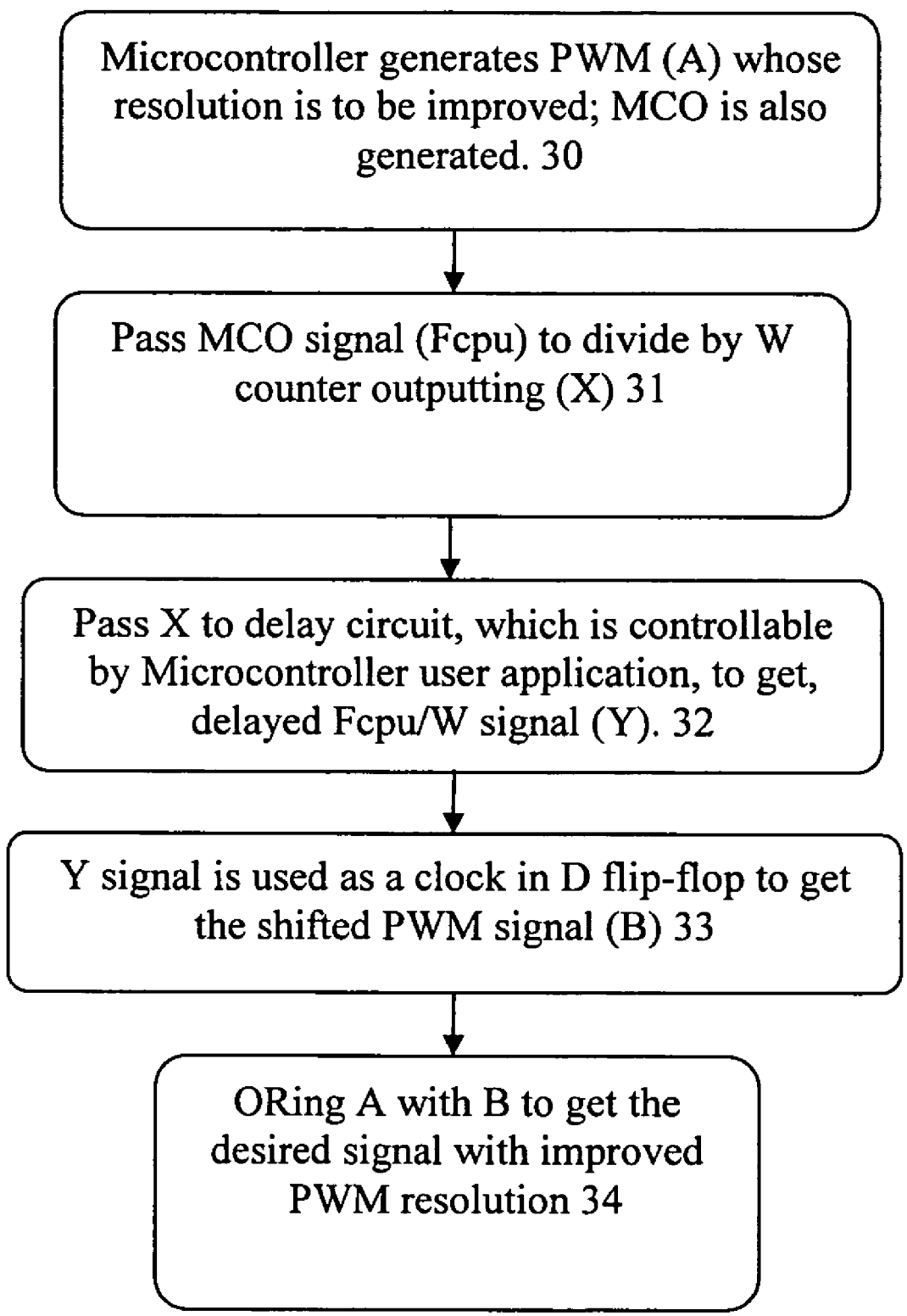
FIG. 3 shows the flowchart of the steps of the method in accordance with the invention.

FIG. 3 shows a flowchart in accordance with one embodiment of the invention. The microcontroller generates a PWM pulse signal (A) whose resolution is to be improved and also generates an MCO signal 30. The MCO signal (Fcpu) is passed through the divide by W counter to obtain the divided output signal X 31. The output signal X is passed to the delay circuit, which is controllable by microcontroller user application, to get, delayed Fcpu/W 32. This delayed signal represented by Y is used as a clock in the D flip-flop 5 to get the shifted PWM signal (B) 33. The signals A and B are ORed to get the desired signal with improved PWM resolution 34.

Embodiments of the present invention can be utilized in a variety of different types of electronic systems, such as for the generation of sinusoidal signals in a UPS or other type of system, or to generate a PWM signal for use in other applications as well.

From the foregoing it will be appreciated that, although specific embodiments of the invention have been described herein for purposes of illustration, various modifications may be made without deviating from the spirit and scope of the invention.

I claim:

1. A system for generating Pulse Width Modulated signal having variable duty cycle resolution comprising:
   a microcontroller for generating a master clock output;
   a divide by W counter having its input connected to said master clock output of said microcontroller providing a divided clock output;
   a delay circuit having its input connected to the output of said divide by W counter for introducing a delay in said divided clock output;
   a flip-flop having its data input connected to a second output of said microcontroller and its clock being connected to the output of said delay circuit for shifting said second output of said microcontroller; and
   a logic gate receiving the outputs of said flip flop and said second output of said microcontroller for providing an improved resolution PWM waveform.

2. The system as claimed in claim 1 wherein said delay circuit includes a multiplier block that feedbacks the signal M number of times to introduce desired delay.

3. The system as claimed in claim 1 wherein said system provides a PWM waveform with resolution up to a fraction of the time period of Central Processing Unit ($T_{CPU}$).

4. The system as claimed in claim 1 wherein said logic gate is an OR gate.

5. The system as claimed in claim 1 wherein a second signal on the second output is a pulse width modulated signal.

6. The system as claimed in claim 1 wherein said flip-flop is D-flip flop.

7. A method for generating Pulse Width Modulated signal having variable duty cycle resolution comprising the steps of:
   generating master clock output;
   providing a divided master clock output;
   delaying said divided master clock output;
   shifting pulse width modulated signal using said delayed signal as clock; and
   performing a logic operation on said pulse width modulated signal and shifted pulse width modulated signal to obtain the improved resolution PWM waveform.

8. The method as claimed in claim 6 wherein said method provides a PWM waveform with resolution up to a fraction of the time period of Central Processing Unit ($T_{CPU}$).

9. The method as claimed in claim 6 wherein said logic operation is OR operation.

10. A circuit for a generating pulse width modulated signal having a variable duty cycle resolution, the circuit comprising:
    a clock generation circuit for generating a master clock output signal and a first pulse width modulated signal;
    a clock divider circuit coupled to the clock generation circuit and operable to generate a divided clock output signal responsive to the master clock output signal;
    a delay circuit coupled to the clock divider circuit to receive the divided clock output signal and operable to generate a delayed divided clock output signal; and
    a logic circuit coupled to clock generation circuit to receive to first pulse width modulated signal and coupled to the delay circuit to receive the delayed divided clock output signal, the logic circuit operable to develop a shifted pulse width modulated signal responsive to the first pulse width modulated signal and the delayed divided clock output signal and to develop a second pulse width modulated signal responsive to the first pulse width modulated signal and the shifted pulse width modulated signal.

11. The circuit of claim 10 wherein the clock generation circuit comprises a microcontroller.

12. The circuit of claim 10 wherein the clock divider circuit comprises a divide by W counter.

13. The circuit of claim 10 further comprising a feedback circuit coupled to receive the delayed divided clock output signal and a control value from the clock generation circuit, and operable to generate a feedback signal responsive to the delayed divided clock output signal and control signal and to apply the feedback signal to the delay circuit to adjust a delay of the delayed divided clock output signal.

14. An electronic system, comprising:
    a circuit for a generating pulse width modulated signal having a variable duty cycle resolution, the circuit comprising:
      a clock generation circuit for generating a master clock output signal and a first pulse width modulated signal;
      a clock divider circuit coupled to the clock generation circuit and operable to generate a divided clock output signal responsive to the master clock output signal;
    a delay circuit coupled to the clock divider circuit to receive the divided clock output signal and operable to generate a delayed divided clock output signal; and
      a logic circuit coupled to clock generation circuit to receive to first pulse width modulated signal and coupled to the delay circuit to receive the delayed divided clock output signal, the logic circuit operable to develop a shifted pulse width modulated signal responsive to the first pulse width modulated signal and the delayed divided clock output signal and to develop a second pulse width modulated signal responsive to the first pulse width modulated signal and the shifted pulse width modulated signal; and
    electronic circuitry coupled to the circuit for a generating pulse width modulated signal.

15. The electronic system of claim 14 wherein the electronic circuitry comprises UPS circuitry.

16. The circuit of claim 14 wherein the clock generation circuit comprises a microcontroller.

17. The circuit of claim 14 wherein the clock divider circuit comprises a divide by W counter.

18. The circuit of claim 14 further comprising a feedback circuit coupled to receive the delayed divided clock output signal and a control value from the clock generation circuit, and operable to generate a feedback signal responsive to the delayed divided clock output signal and control signal and to apply the feedback signal to the delay circuit to adjust a delay of the delayed divided clock output signal.

19. A method for generating a pulse width modulated signal having a variable duty cycle resolution, the method comprising:
    generating a first pulse width modulated signal;
    generating a master clock signal;
    generating a divided master clock signal responsive to the master clock signal;
    delaying the divided master clock signal to develop a delayed divided master clock signal;

shifting the first pulse width modulated signal responsive to the delayed divided master clock signal to develop a shifted pulse width modulated signal; and generating a second pulse width modulated signal responsive to the first pulse width modulated signal and the shifted pulse width modulated signal.

20. The method of claim 19 wherein the second pulse width modulated signal has a resolution up to a fraction of a time period of the master clock signal.

* * * * *